United States Patent
Gambetta et al.

(10) Patent No.: US 11,222,279 B2
(45) Date of Patent: Jan. 11, 2022

(54) MODULAR QUANTUM CIRCUIT TRANSFORMATION

(71) Applicant: International Business Machines Corporation, Armonk, NY (US)

(72) Inventors: Jay M. Gambetta, Yorktown Heights, NY (US); Ismael Faro Sertage, Chappaqua, NY (US); Ali Javadiabhari, Sleepy Hollow, NY (US); Francisco Jose Martin Fernandez, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 361 days.

(21) Appl. No.: 16/388,369

(22) Filed: Apr. 18, 2019

(65) Prior Publication Data

US 2020/0334563 A1 Oct. 22, 2020

(51) Int. Cl.
*G06N 10/00* (2019.01)
*B82Y 10/00* (2011.01)

(52) U.S. Cl.
CPC ............ *G06N 10/00* (2019.01); *B82Y 10/00* (2013.01)

(58) Field of Classification Search
CPC ...................................................... G06N 10/00
See application file for complete search history.

(56) References Cited

U.S. PATENT DOCUMENTS

| | | |
|---|---|---|
| 2017/0257385 A1 | 9/2017 | Overson et al. |
| 2018/0260245 A1 | 9/2018 | Smith |
| 2019/0019103 A1 | 1/2019 | Dadashikelayeh |

OTHER PUBLICATIONS

Maslov et al. "Quantum Circuit Simplification and level Compaction," https://arxiv.org/abs/quant-ph/0604001 (Year: 2008).*
The Free Dictionary "Definition of identity function," https://www.thefreedictionary.com/Identity+transformation (Year: 2021).*
McCaskey et al. "Quantum Computer Programming, Compilation, and Execution with XACC." Bulletin of the American Physical Society (2018).

(Continued)

*Primary Examiner* — Matthew L Reames
(74) *Attorney, Agent, or Firm* — Garg Law Firm, PLLC; Rakesh Garg; Joseph Petrokaitis

(57) ABSTRACT

A hybrid data processing environment, including a classical and a quantum computing system, is configured. A configuration of a first quantum circuit, executable using the quantum computing system is produced. A first analysis operation is configured for use in a first analysis pass. The first analysis operation specifies a type of analysis to be performed on the quantum circuit. Using an output of an execution of the first analysis operation, a portion of the first quantum circuit that should be transformed to satisfy a constraint on the quantum circuit design is identified. In a first transformation pass according to a first transformation operation, the portion is transformed, resulting in a second quantum circuit, by reconfiguring a gate in the first quantum circuit such that a qubit used in the gate complies with the constraint on the quantum circuit design while participating in the second quantum circuit.

17 Claims, 11 Drawing Sheets

(56) References Cited

OTHER PUBLICATIONS

Tezak et al., "Compiler tools for hybrid quantum-classical algorithms." Bulletin of the American Physical Society (2019).
Cross et al. "Validating quantum computers using randomized model circuits." arXiv preprint arXiv:1811.12926 (2018).
Andres et al., Transpiler-based architecture for multi-platform web applications. 2017 IEEE Second Ecuador Technical Chapters Meeting (ETCM). IEEE, 2017.
Santos, et al. "Lemonade: A scalable and efficient Spark-based platform for data analytics." Proceedings of the 17th IEEE/ACM International Symposium on Cluster, Cloud and Grid Computing. IEEE Press, 2017.

* cited by examiner

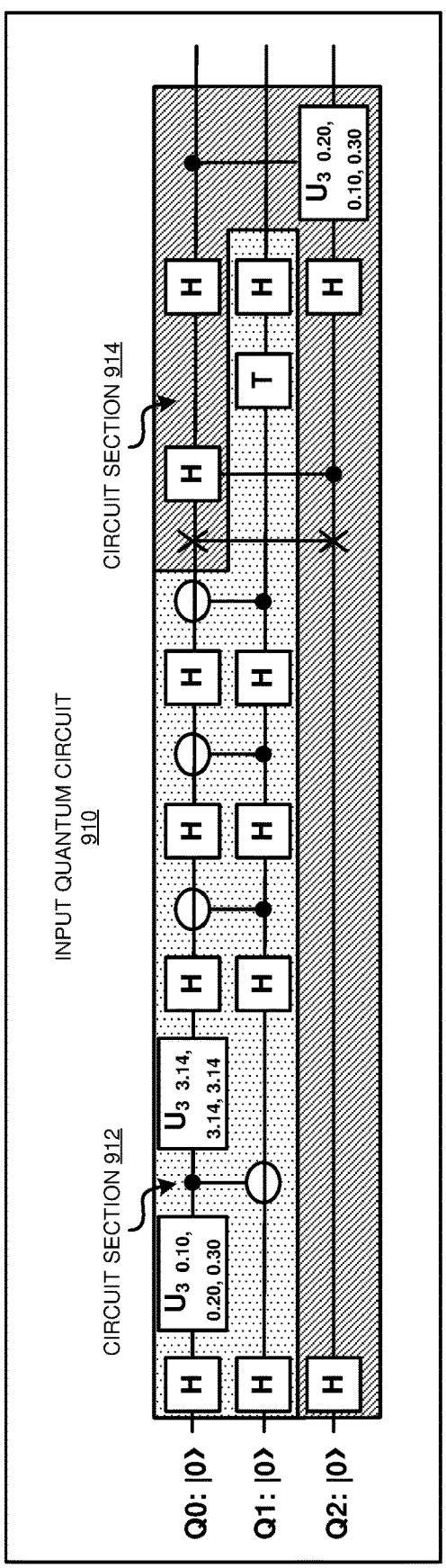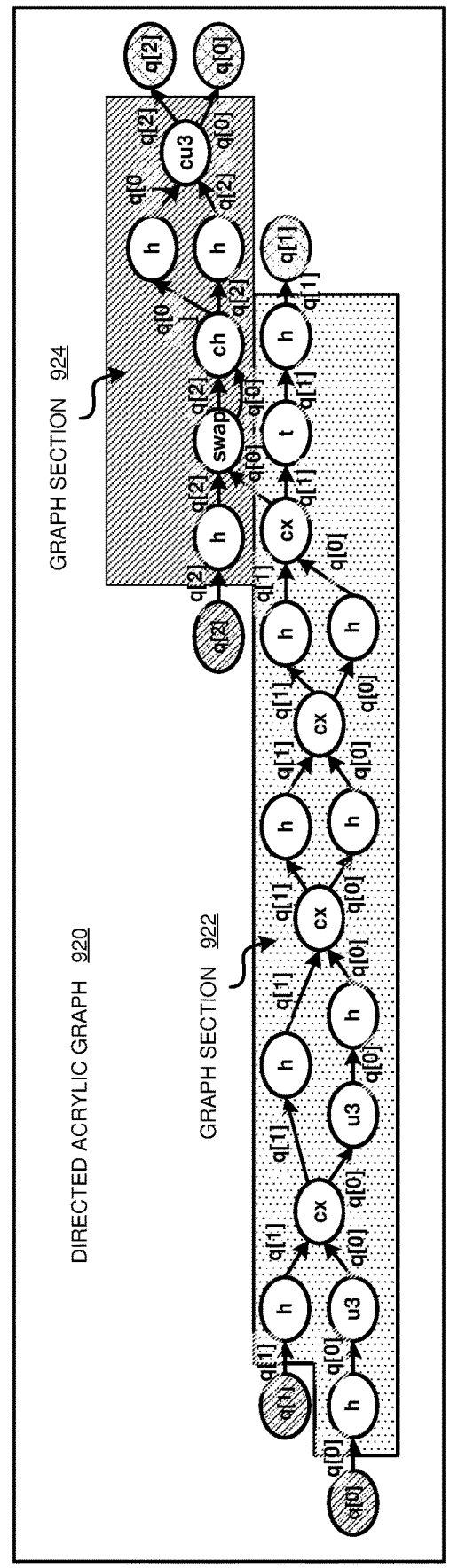
*FIGURE 9*

MODULAR QUANTUM CIRCUIT TRANSFORMATION

TECHNICAL FIELD

The present invention relates generally to a method, system, and computer program product for quantum programming. More particularly, the present invention relates to a method, system, and computer program product for modular quantum circuit transformation.

BACKGROUND

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational operations. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing. Herein, a qubit is the physical carrier of quantum information. A qubit is the quantum version of a bit in classical computing, and can have quantum states of $|0>$, $|1>$, or the linear combination of both.

Quantum computing can often be used to solve problems more quickly than in conventional computing. For example, one quantum algorithm is Grover's Search, which accomplishes searching through an unordered list of N items with fewer lookups than is the case in conventional computing.

Quantum gates are the elementary building blocks for quantum computation, acting on qubits the way classical logic gates act on bits, one and two at a time, to change qubit states in a controllable way. An X gate inverts the state of a single qubit, much like a NOT gate inverts the state of a single bit in classical computing. An H gate, or Hadamard gate, puts a single qubit into a state of superposition, a combination of the 0 and 1 quantum states. The qubit only resolves to a definite state when measured. For example, when provided with an input having a quantum state of 0, within the Hadamard gate the quantum state is in superposition, but the output has a 50 percent probability of being in the quantum 0 state and a 50 percent probability of being in the quantum 1 state. Other single-qubit gates alter the qubit state in other defined ways.

Multi-qubit gates implement gates that perform conditional logic between qubits, meaning the state of one qubit depends on the state of another. For example, a Controlled-NOT, or CNOT gate, has two qubits, a target qubit and a control qubit. If the control qubit is in the 1 quantum state, the CNOT gate inverts the state of the target qubit. If the control qubit is in the 0 quantum state, the CNOT gate does not change the state of the target qubit.

Multiple qubits can also be entangled. Two or more qubits are entangled when, despite being too far apart to influence one another, they behave in ways that are individually random, but also too strongly correlated to be explained by supposing that each object is independent from the other. As a result, the combined properties of an entangled multi-qubit system can be predicted, but the individual outcome of measuring each individual qubit in such a system cannot.

Similar to conventional computing, quantum computing gates can be assembled into larger groups, called quantum circuits, to perform more complicated operations. For example, a SWAP gate, which exchanges the states of a pair of qubits, can be constructed from three CNOT gates.

Quantum circuits can perform some operations in parallel, and some in series. The length of the longest series in the program is also referred to as the depth of the quantum circuit. For example, the three CNOT gates comprising a SWAP gate are arranged in series, giving a depth of 3. Programs with a shallower depth take less execution time and provide better performance, so are preferred.

Conventional computers do not have to be hand-programmed with specific instruction steps, such as those provided in processor-specific assembly languages. Instead, programmers write hardware-independent code in a higher-level language, and a compiler translates this code into assembly language for execution on a specific processor. Similarly, in quantum computing programmers do not have to specify individual gates. Instead, programmers can write higher-level code in a higher-level language. A compiler parses this code and maps it into a quantum circuit. Finally, a quantum processor executes the quantum circuit. Quantum programmers can also make use of already-programmed libraries, for use in solving problems in areas such as chemistry, artificial intelligence, and optimization.

SUMMARY

The illustrative embodiments provide a method, system, and computer program product. An embodiment includes a method that configures a hybrid data processing environment comprising a classical computing system and a quantum computing system. An embodiment produces a configuration of a first quantum circuit from the classical computing system, the first quantum circuit being executable using the quantum computing system. An embodiment configures, for use in a first analysis pass, a first analysis operation, wherein the first analysis operation specifies a type of analysis to be performed on the quantum circuit. An embodiment identifies, using an output of an execution of the first analysis operation, a portion of the first quantum circuit that should be transformed to satisfy a constraint on the quantum circuit design. An embodiment transforms the portion, in a first transformation pass according to a first transformation operation, resulting in a second quantum circuit, by reconfiguring a gate in the first quantum circuit such that a qubit used in the gate complies with the constraint on the quantum circuit design while participating in the second quantum circuit.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

Certain novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 9 depicts another example of modular quantum circuit transformation in accordance with an illustrative embodiment;

DETAILED DESCRIPTION

Figure 1:
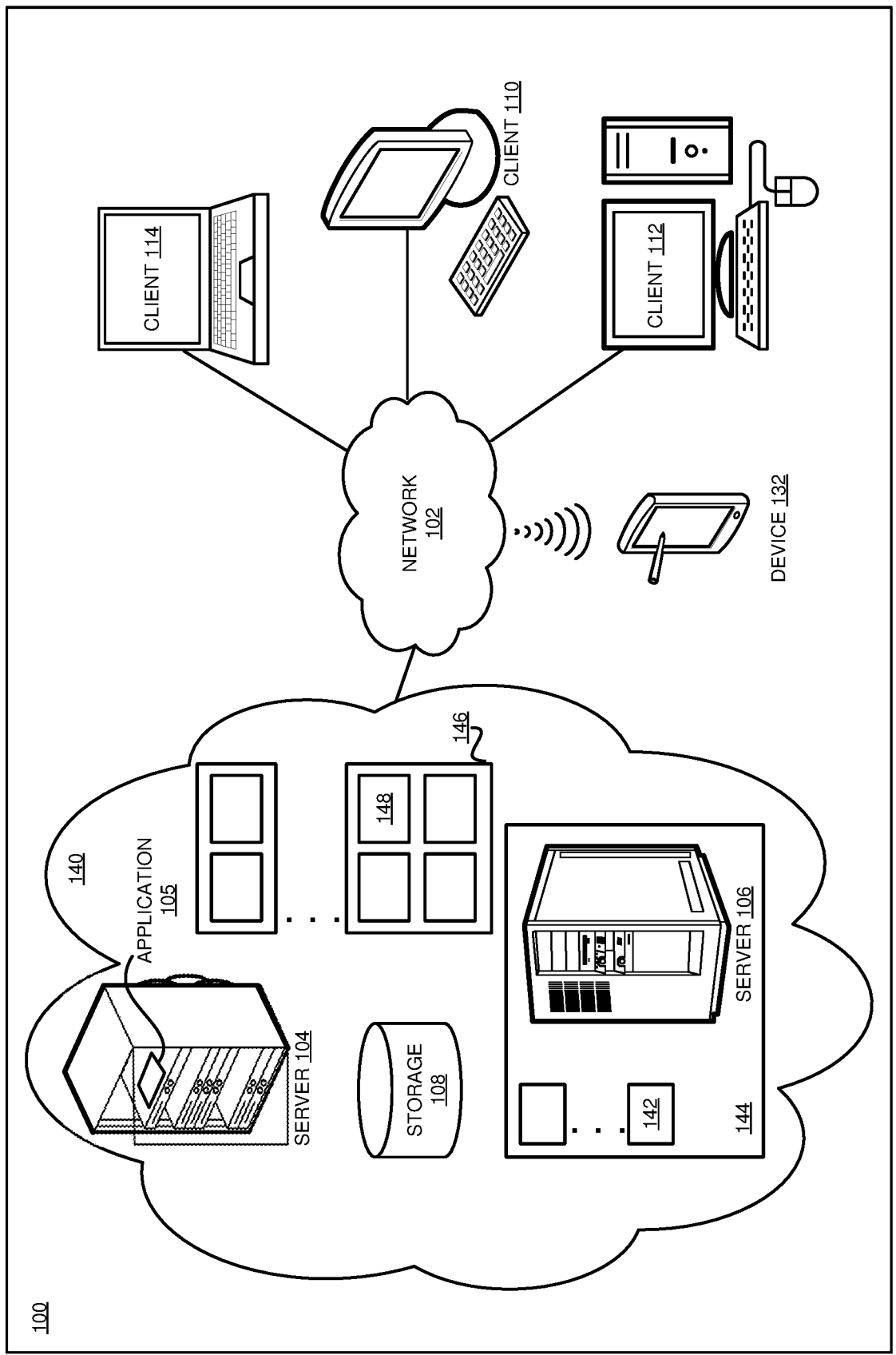
FIG. 1 depicts a block diagram of a network of data processing systems in which illustrative embodiments may be implemented.

The illustrative embodiments recognize that the quantum circuit produced by a compiler is not necessarily the most efficient quantum circuit capable of producing the same result. Just as optimizing compilers optimize compiled code for conventional processors, so too a transpiler is needed to optimize quantum circuits meant to run on quantum processors. As used herein, transpilation refers to transforming a quantum circuit into another quantum circuit that produces the same outputs from the same inputs as does the original quantum circuit. Optimizing refers to refining a quantum circuit so that its execution incurs lower cost, typically by taking less time to execute, better accuracy—e.g., by using a configuration of different or fewer qubits to minimize interference or decoherence, or some combination thereof.

Compiler optimizations for classical programs, such as classical dataflow based optimizations and stochastic optimizations, do not apply to quantum circuits because outputs from the two types of programs differ. For classical programs, the program state is deterministic and the output is simply the program state when execution completes. For quantum circuits, the program state represents a probability distribution of all possible outcomes, and the output is merely a sample from the distribution. As a result, outputs change from run to run non-deterministically.

Existing techniques for optimizing quantum circuits follow ad-hoc heuristics, relying on correctness-preserving rules or templates specified by human experts. However, such ad-hoc heuristics are simply methods that have been successful, more times than not, in optimizing quantum circuits in the past. Such methods are not guaranteed to be equally successful in optimizing quantum circuits in the future.

The illustrative embodiments also recognize that a compiler often produces a generic quantum circuit. Such a generic quantum circuit is not specific to a particular quantum processor configuration. Each quantum processor, although having the same hardware configuration (e.g. having the same number of qubits), can have varying properties. Such properties, such as how long a qubit can remain in a particular quantum state before decaying to another quantum state, how long a qubit can remain in a superimposed state before decaying to a particular quantum state, the frequency of a particular qubit, gate error (i.e. the rate at which a quantum gate or operation gives an incorrect result), and the like, change over time. Quantum processors require periodic calibration to account for this variability. Thus, the illustrative embodiments recognize that such calibration results can affect the performance of a quantum circuit.

The illustrative embodiments also recognize that a provider may want to modularize quantum circuit optimizations. Quantum computing is a rapidly evolving field. Modularization allows for ease of adaptation to additional quantum processor configurations, such as processors with additional qubits or qubit coupling options. Modularization also allows for the rapid implementation of additional optimization techniques as such optimizations are developed. As well, modularization allows a provider to control the computing environment in which a particular optimization executes.

As a result, what is needed in the art is a technique for transpiling quantum circuits to optimize such programs in a modular manner that is adaptable to a particular quantum processor configuration.

The illustrative embodiments recognize that the presently available tools or solutions do not address these needs or provide adequate solutions for these needs. The illustrative embodiments used to describe the invention generally address and solve the above-described problems and other problems related to modular quantum circuit optimization.

An embodiment can be implemented as a combination of certain q-computing hardware components and a software application. An implementation of the software application portion of an embodiment, or one or more components thereof, can be configured as a modification of an existing classical portion of a hybrid quantum-classical processing environment, as a separate classical computing application that operates in conjunction with an existing hybrid quantum-classical processing environment, as a standalone application, or some combination thereof.

Particularly, some illustrative embodiments provide a method by which a quantum circuit is transformed, or transpiled, into another quantum circuit having equivalent output, but better performance, than the original.

An embodiment configures a hybrid data processing environment including a classical computing environment and a quantum computing environment. In accordance with the illustrative embodiments, the environment includes at least one quantum compute node (QCN), and at least one conventional node (CN) on which an embodiment can execute. Such a computing environment is hereinafter referred to as a quantum computing environment (QCE). The QCE may include one or more CNs in a suitable configuration—such as a cluster—to execute applications using conventional binary computing. The hybrid environment can be implemented using cloud computing architecture.

An embodiment also produces, in the classical computing environment, a quantum circuit that can be executed using the quantum computing environment. For convenience in further processing the quantum circuit, an embodiment models the circuit using a graph format, for example a directed acrylic graph (DAG). A graph includes a collection of edges connecting pairs of vertices. In a directed graph, each edge has an orientation, from one vertex to another. And in a directed acrylic graph, there are no paths, along edges from one vertex to another, that loop back to a starting vertex.

In the DAG format, an embodiment models each input qubit as a starting vertex, and models each output qubit as an ending vertex. Between starting and ending vertices, an embodiment models operations on qubits as vertices. Just as a wire, representing a qubit, connects one gate to another in a quantum circuit representation, a graph edge, representing a qubit, connects one vertex to another in a DAG representation of the quantum circuit. Using such a DAG format, dataflow and dependencies between elements are explicit, and thus easier for an embodiment to manipulate than a circuit or text representation of a quantum circuit. However, an embodiment need not be configured to use a graph format, or any particular graph format, and other quantum circuit representations are contemplated within the scope of the illustrative embodiments.

An embodiment also stores metadata for the quantum circuit. Metadata, as used herein, refers data about the circuit. The metadata includes input and output information about the quantum circuit as well as information produced during the circuit transformation process. For example, input metadata can specify specific attributes of a quantum processor for which the quantum circuit should be adapted, or a specific type of transformation to be performed on the quantum circuit. The circuit depth and commuting sets within the circuit are both examples of metadata produced during the circuit transformation process.

An embodiment includes, in the classical computing environment, a set of operations. A operation describes an operation to be performed on a quantum circuit. An embodiment performs two types of operations: analysis operations and transformation operations.

An analysis operation specifies an analysis to be performed on a quantum circuit, producing metadata. To do this, an analysis operation has read-only access to the stored representation of the quantum circuit, and write-only access to the metadata store.

As one non-limiting example, one analysis operation divides a quantum circuit into portions, for example, a portion including CNOT gates and a portion without CNOT gates. To do this division operation, an embodiment traverses the DAG model of the circuit, collecting all the predecessor and successor vertices of a CNOT vertex until encountering a branch. The branch marks the boundary between the portion including CNOT gates and a portion without CNOT gates. As another non-limiting example, a different analysis operation computes the depth of a quantum circuit.

A transformation operation specifies one or more transformations to be performed on a quantum circuit to reconfigure the circuit into a different, but equivalent, quantum circuit. In other words, a transformation reconfigures a gate in the first quantum circuit such that a qubit used in the gate complies with a constraint on the quantum circuit design while participating in the first quantum circuit. To do this, a transformation operation has read-only access to the metadata store, and write-only access to the stored representation of the quantum circuit.

For example, a particular quantum processor might have a restriction on which qubits are coupled together, and hence able to communicate, with which other qubits. To adapt a circuit to this quantum processor, a transformation operation redistributes gates into different portions of a quantum circuit.

Reducing the number of gates in a quantum circuit improves circuit efficiency. Thus, another example transformation operation rearranges target and control inputs of gates, according to specific transformation rules, to remove redundant gates from a circuit.

It can be desirable, for ease of implementation and hardware efficiency, to implement a particular gate as a circuit of other, simpler or different, gates. For example, any 2-qubit gate can be decomposed into at most 3 CNOT gates. Thus, another example transformation operation decomposes a 2-qubit gate into CNOT gates.

As can be appreciated, the described examples of analysis operations and transformation operations are not intended to be limiting on the illustrative embodiments. Many types of analysis and transformation operations are possible and such other operations are contemplated within the scope of the illustrative embodiments. To facilitate development and use of additional operations, while maintaining a consistent interface through which operations can be accessed, an embodiment stores operations in an operation library. New operations can be added to the operation library, and obsolete operations removed, in a modular fashion, without affecting other operations in the library. The operation library can also store operations provided by different providers and allow performance of particular operations in return for particular payments.

An embodiment maintains, for each operation in the operation library, a corresponding execution parameter. An execution parameter specifies a restriction on performance of a particular operation.

An execution parameter can specify a computational resource requirement of an operation. Some operations may be more computationally complex than other operations. An available computing resource may be unable to perform an operation that is more computationally complex than a threshold complexity. Another available computing resource may be able to perform an operation that is more computationally complex than a threshold complexity, but that performance would take more than a threshold amount of time. In both cases, an embodiment can be configured to perform the operation in accordance with the computational resource requirement, by selecting a different available computing resource that can perform the operation, or that can perform the operation in under the threshold amount of time.

An execution parameter can specify a policy associated with an operation. A user policy specifies a user, or a type of user, that is authorized to use a particular operation. For example, an administrator of an embodiment might want to restrict performance of certain premium operations to a particular group of users, such as users within the same company as the administrator, users who have paid for operation performance, or users who have paid a specific fee for a specific operation, or type of operation, performance. A location policy specifies a particular computing resource, or particular type of computing resource, to perform a particular operation. For example, an administrator of an embodiment might want to restrict performance of certain operations to behind a firewall, to prevent the code executing those operations from being exposed to outsiders. Another administrator of an embodiment might want to restrict performance of certain operations to a particular country, to comply with a geographic restriction on the execution of those operations.

Other execution parameters are also possible and contemplated within the scope of the illustrative embodiments. As well, other execution parameters may apply only to analysis operations, only to transformation operations, or to all operations.

An embodiment begins with a quantum circuit to be transpiled. One embodiment also takes, as input, configuration and calibration information for a specific quantum processor implementation. Using the configuration and calibration information, the embodiment determines which analysis and transformation operations should be used to transpile a quantum circuit. Thus, using the selected operations, an embodiment transforms a generic input quantum circuit into a circuit that is adapted for a specific configuration of a specific quantum processor.

Another embodiment takes, as input, a transpilation goal. A transpilation goal specifies a type of processing to be performed on the quantum circuit. For example, one transpilation goal might be to reduce the depth of the quantum circuit.

An embodiment selects and schedules specific operations for execution. One embodiment alternates an analysis pass with a transformation pass. In an analysis pass, an embodiment selects an analysis operation from the operation library, configures the selected operation with an associated execution parameter, and performs the configured operation on a quantum circuit, producing results of the analysis as metadata. Using the results of the analysis, an embodiment identifies a portion of the quantum circuit that should be transformed to satisfy a constraint on the quantum circuit design. Then, in a transformation pass, an embodiment selects a transformation operation from the operation library, configures the selected operation with an associated execution parameter, and uses the metadata (including the analysis results) to transform, using the configured transformation operation, the portion of the quantum circuit. The transformed portion satisfies the constraint.

An embodiment continues in this fashion, alternating analysis and transformation passes, until an end criterion is reached. In one embodiment, an end criterion is an analysis result that conforms to the transpilation goal. For example, a transpilation goal may have been to reduce the depth of the quantum circuit to a specified depth. Once an analysis shows that the depth is at or below the specified depth, the circuit has been sufficiently transformed and transformation can end.

In another embodiment, an end criterion is the execution of a particular number of passes. In another embodiment, an end criterion is a cumulative use of computing resources above a threshold amount. Execution limits such as these prevent a transformation process from executing infinitely, attempting to reach an unreachable transpilation goal. Other end criteria, or combinations of end criteria, are also possible and contemplated within the scope of the illustrative embodiments.

In addition, although alternating analysis and transformation passes is typical, such a pattern is not required. For ease of implementation, it may be desirable to implement a large analysis or transformation in multiple modules, each stored in the operation library as a separate operation. In such a case, two or more analysis passes might be executed without an intervening transformation pass, or two or more transformation passes might be executed without an intervening analysis pass. Another embodiment selects a set of analysis operations and transformation operations from the operation library, configures each selected operation with an associated execution parameter, determines an execution order for the set of operations, and performs each configured operation in the selected order.

The manner of modular quantum circuit transformation described herein is unavailable in the presently available methods. A method of an embodiment described herein, when implemented to execute on a device or data processing system, comprises substantial advancement of the functionality of a quantum circuit by generating a more optimized quantum circuit producing the same results as the original in a shorter time, with faster execution and using fewer resources, while performing the optimizing in a modular manner with execution and access controls.

The illustrative embodiments are described with respect to certain types of quantum circuits, quantum gates, qubits, quantum processors, thresholds, constraints, operations, execution parameters, analyses, transformations, end criteria, measurements, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, operations, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments.

Furthermore, a particular illustrative embodiment may have some, all, or none of the advantages listed above.

Figure 2:
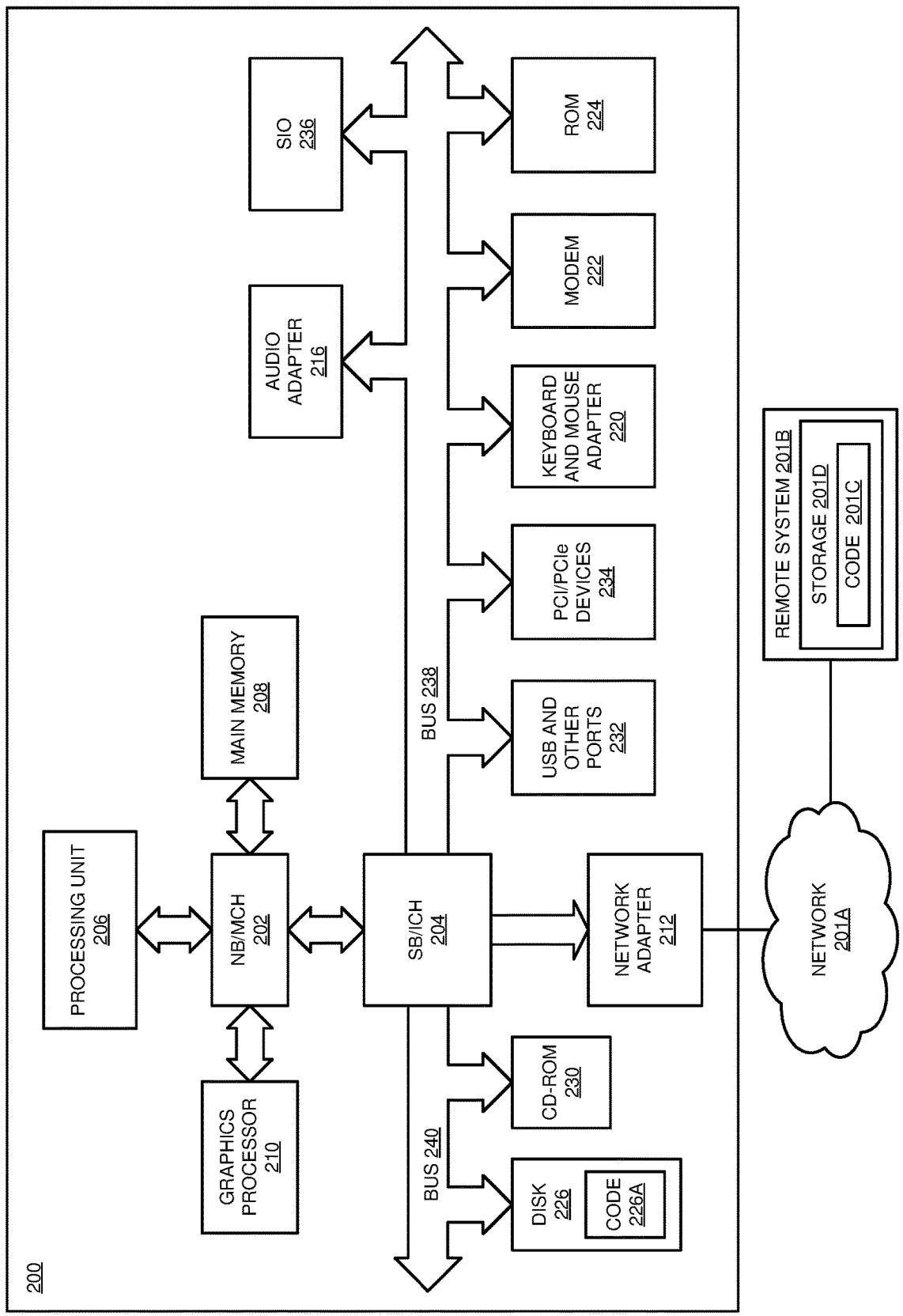
FIG. 2 depicts a block diagram of a conventional data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

QCE 140 is an example of a QCE described herein. As an example, QCE 140 includes CN 104, 106, and many other similar CNs 142. As an example, CNs 106 and 142 may be configured as cluster 144 of CNs. QCE 140 further includes one or more QCNs, such as QCN 146. A QCN, such as QCN 146, comprises one or more q-processors 148. A currently viable qubit is an example of q-processor 148. Application 105 implements an embodiment described herein. Application 105 operates on a CN, such as server 104 in QCE 140. Application 105 stores an operation library, circuits, and metadata in storage 108, or in any other suitable storage.

QCE 140 may couple to network 102 using wired connections, wireless communication protocols, or other suitable data connectivity. Clients 110, 112, and 114 may be, for example, personal computers or network computers. Network 102 may represent a collection of networks and gateways that use the Transmission Control Protocol/Internet Protocol (TCP/IP) and other protocols to communicate with one another. FIG. 1 is intended as an example, and not as an architectural limitation for the different illustrative embodiments.

Data processing environment 100 as a whole may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a conventional data processing system in which illustrative embodiments may be implemented. Data processing system 200 is an example of a classical computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as server 104 in FIG. 1 in which computer usable program code or instructions implementing the processes of the illustrative embodiments may be located. Data processing system 200 is described as a computer only as an example, without being limited thereto. Implementations in the form of other devices, such as server 104 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
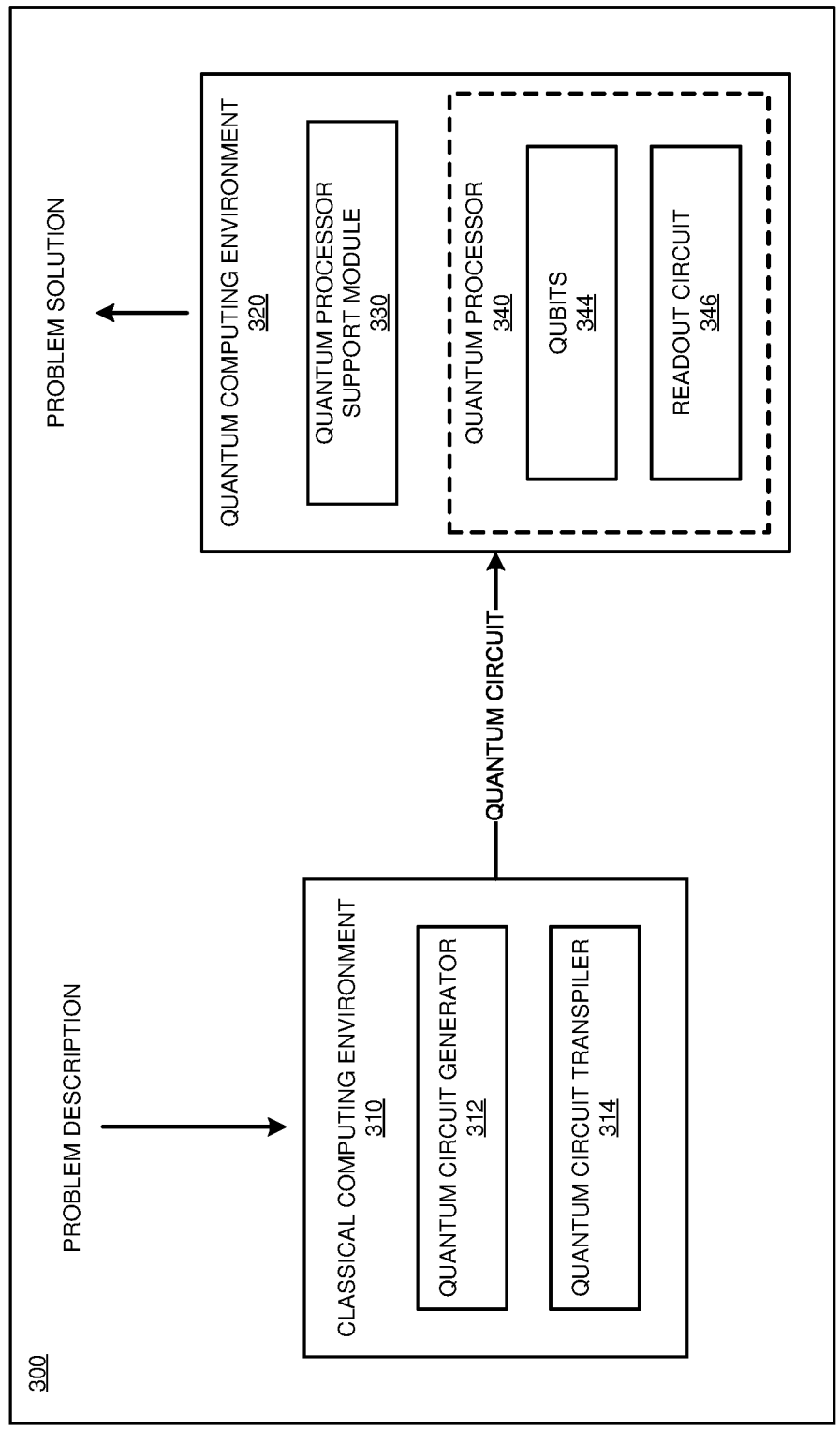
FIG. 3 depicts a block diagram of an example configuration for modular quantum circuit transformation, and execution of the optimized quantum circuit, in accordance with an illustrative embodiment.

With reference to FIG. 3, this figure depicts a block diagram of an example configuration for modular quantum circuit transformation, and execution of the optimized quantum circuit, in accordance with an illustrative embodiment. Cloud 300 is an example of QCE 140 in FIG. 1. Classical computing environment 310 is an example of CCN 104 in FIG. 1. Quantum computing environment 320 is an example of QCN 146 in FIG. 1. Applications 312 and 314 are examples of application 105 in FIG. 1 and execute in server 104 in FIG. 1, or any other suitable device in FIG. 1.

Within classical computing environment 310, quantum circuit generator 312 receives a problem description as an input, and generates a corresponding quantum circuit. Quantum circuit transpiler 314 transpiles the quantum circuit into a different but equivalent quantum circuit.

Then, within quantum computing environment 320, quantum processor 340, including qubits 344 and readout circuit 346, executes the transpiled quantum circuit. Quantum computing environment 320 also includes quantum processor support module 330, which outputs the results of executing the quantum circuit as a solution to the original input problem description.

Figure 4:
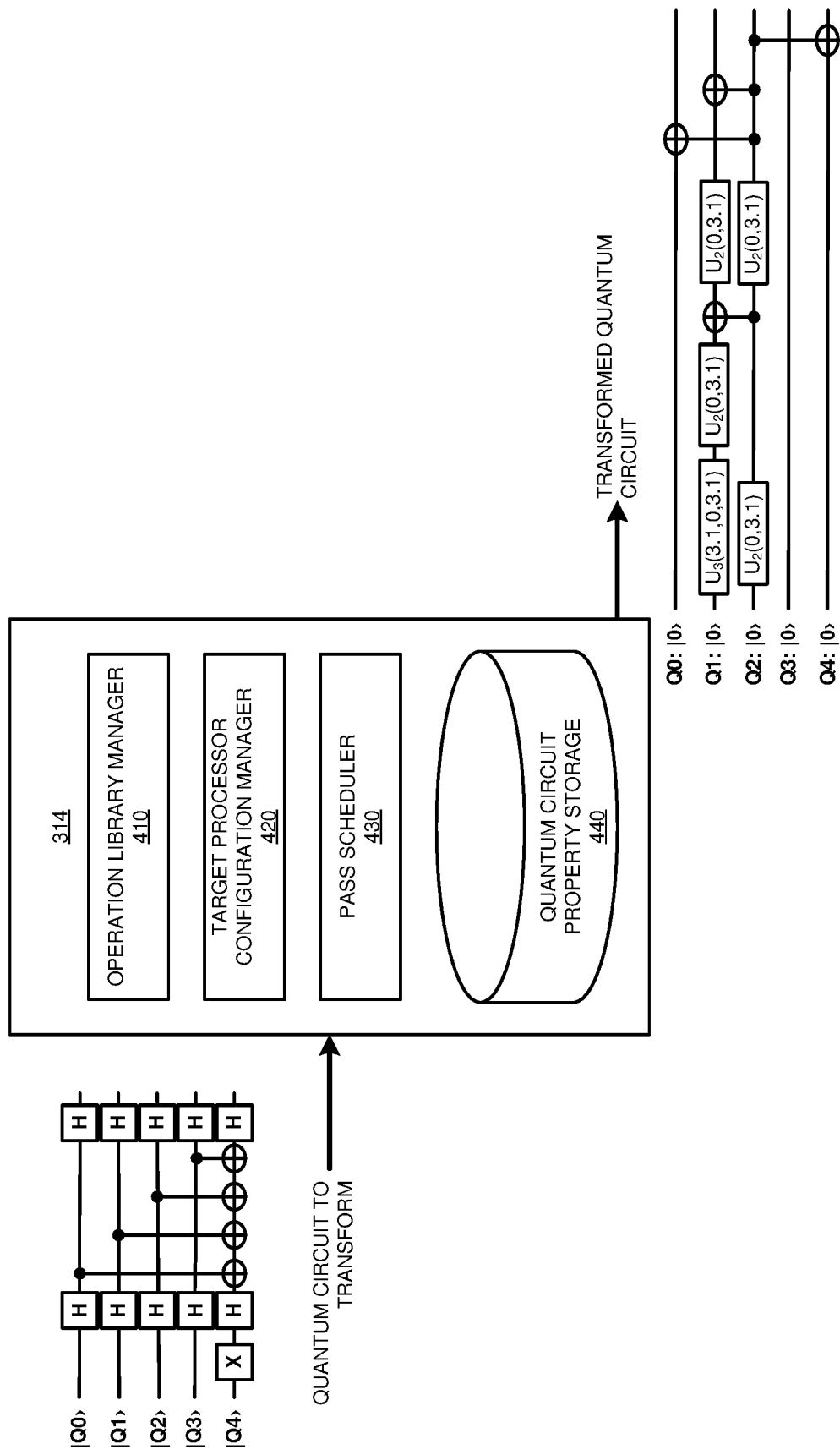
FIG. 4 depicts a block diagram of an example configuration for modular quantum circuit transformation in accordance with an illustrative embodiment.

With reference to FIG. 4, this figure depicts a block diagram of an example configuration for modular quantum circuit transformation in accordance with an illustrative embodiment. Application 314 is the same as quantum circuit transpiler 314 in FIG. 3.

Operation library manager 410 manages an operation library, which includes analysis and transformation operations, in a modular fashion. Operation library manager 410 adds new operations and removes obsolete operations.

Operation library manager 410 also maintains, for each operation in the operation library, a corresponding execution parameter.

Target processor configuration manager 420 determines one or more transformation operations with which to reconfigure a generic input quantum circuit into a circuit that is adapted for a specific configuration of a specific quantum processor. Target processor configuration manager 420 takes, as input, configuration and calibration information for a quantum processor. Using the configuration and calibration information, module 420 determines which analysis and transformation operations should be used to transpile a quantum circuit.

Pass scheduler 430 selects and schedules specific operations for execution in a manner described herein. In one configuration, pass scheduler 430 selects an analysis operation from the operation library managed by operation library manager 410, configures the selected operation with an associated execution parameter, and schedules the configured analysis operation for execution. Once scheduled, the configured operation is executed at an execution location in accordance with the execution parameter, and the results are stored as metadata in quantum circuit property storage 440. Quantum circuit property storage 440 also stores a DAG representation of the quantum circuit being analyzed.

Then pass scheduler 430 selects a transformation operation from the operation library managed by operation library manager 410, configures the selected operation with an associated execution parameter, and schedules the configured transformation operation for execution. Once scheduled, the configured operation is executed at an execution location in accordance with the execution parameter, transforming, using the stored metadata (including the analysis results) the portion of the quantum circuit. A DAG representation of the transformed quantum circuit is also stored in quantum circuit property storage 440.

Figure 5:
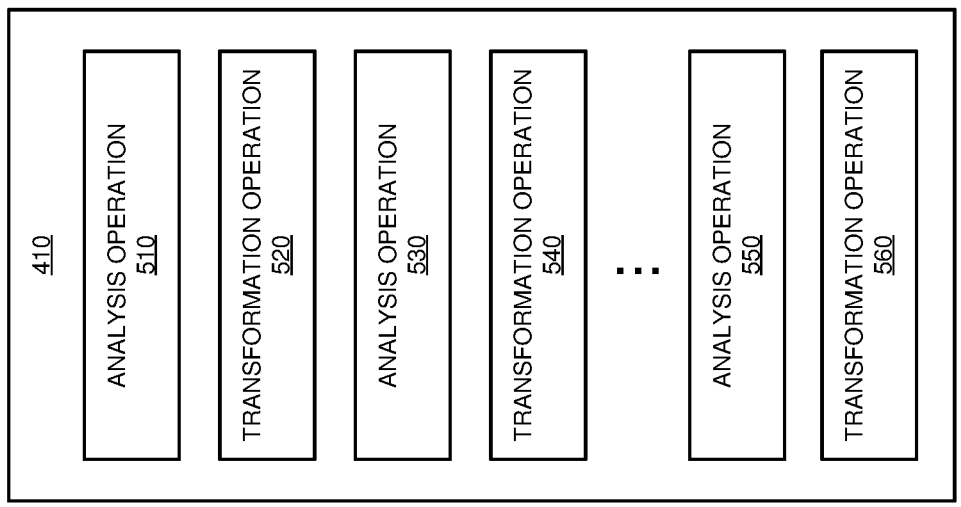
FIG. 5 depicts another block diagram of an example configuration for modular quantum circuit transformation in accordance with an illustrative embodiment.

With reference to FIG. 5, this figure depicts another block diagram of an example configuration for modular quantum circuit transformation in accordance with an illustrative embodiment. In particular, FIG. 5 depicts more detail of operation library manager 410 in FIG. 4.

Operation library manager 410 manages a number of operations, such as analysis operations 510, 530, and 550, and transformation operations 520, 540, and 560. Operation library manager 410 is responsible for adding a new operation to the operation library, removing an obsolete operation from the operation library, and configuring an execution parameter associated with each operation. An execution parameter can specify a complexity measure, a user or location policy, or another restriction on performance of a particular operation.

Figure 6:
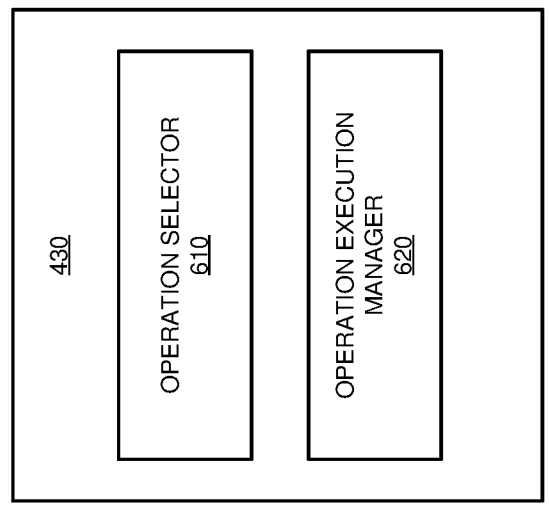
FIG. 6 depicts another block diagram of an example configuration for modular quantum circuit transformation in accordance with an illustrative embodiment.

With reference to FIG. 6, this figure depicts another block diagram of an example configuration for modular quantum circuit transformation in accordance with an illustrative embodiment. In particular, FIG. 6 depicts more detail of pass scheduler 430 in FIG. 4.

In particular, operation selector selects and configures an operation managed by operation library manager 410. Operation execution manager 620 determines, using a operation's execution parameter, an appropriate execution location for the operation, then sends the operation to the appropriate location for execution.

In one example execution order, pass scheduler 430 selects, configures, and schedules analysis operation 510 for execution. Based on the results of performing analysis operation 510, pass scheduler 430 selects, configures, and schedules transformation operation 520 for execution. To determine the results of performing transformation operation 520, pass scheduler 430 selects, configures, and schedules analysis operation 530 for execution. Based on the results of performing analysis operation 530, pass scheduler 430 selects, configures, and schedules transformation operation 540 for execution. To determine the results of performing transformation operation 540, pass scheduler 430 selects, configures, and schedules analysis operation 550 for execution. Based on the results of performing analysis operation 550, pass scheduler 430 selects, configures, and schedules transformation operation 560 for execution.

Figure 7:
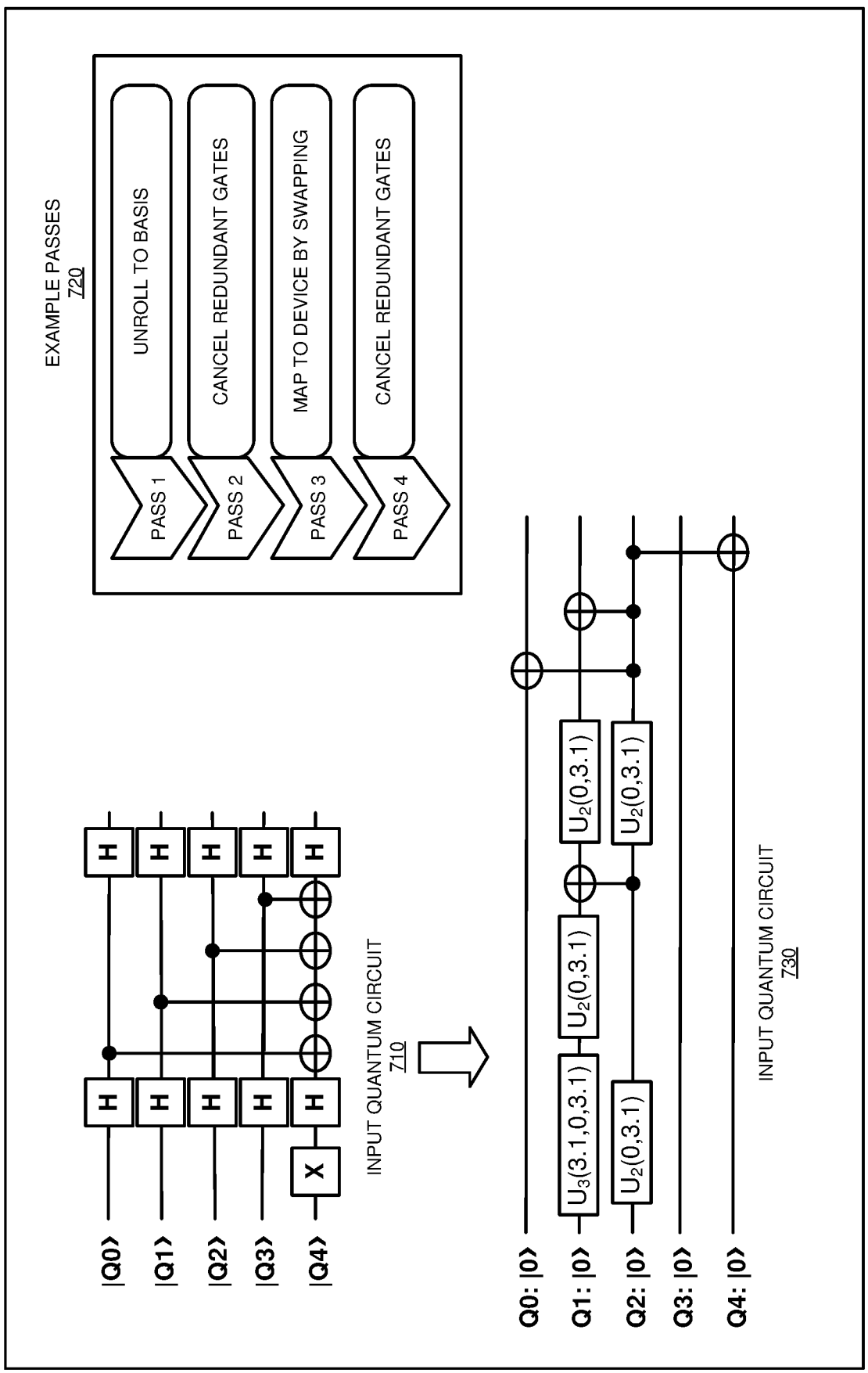
FIG. 7 depicts an example of modular quantum circuit transformation in accordance with an illustrative embodiment.

With reference to FIG. 7, this figure depicts an example of modular quantum circuit transformation in accordance with an illustrative embodiment. In particular, FIG. 7 depicts results of executing quantum circuit transpiler 314 in FIG. 3.

Application 314 takes, as input, input quantum circuit 710. Application 314 also takes, as input, additional information, such as a transpilation goal or configuration and calibration information for a specific quantum processor implementation. Application 314 schedules, configures, and performs several passes, such as example passes 720, to transpile input quantum circuit 710 into output quantum circuit 730. Application 314 also schedules, configures, and performs additional analysis passes (not shown) as necessary to obtain data required to perform example passes 720.

Figure 8:
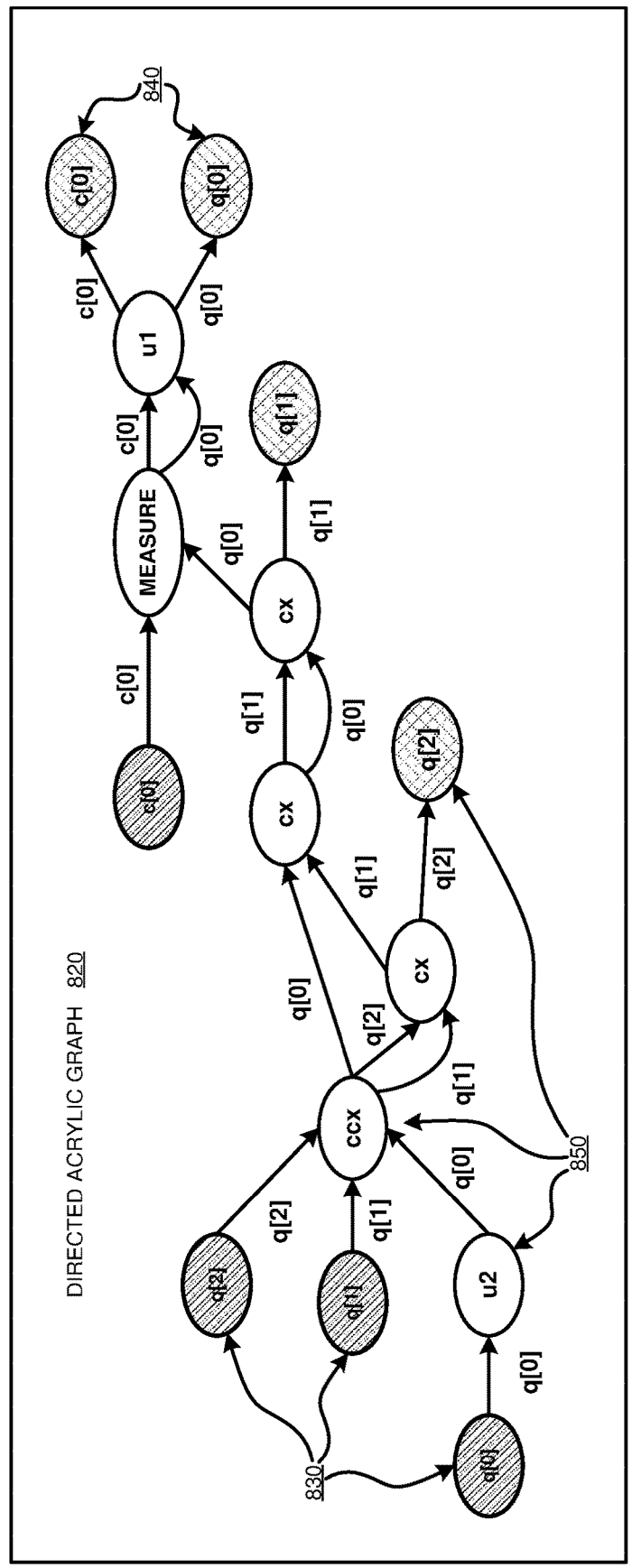
FIG. 8 depicts another example of modular quantum circuit transformation in accordance with an illustrative embodiment.

With reference to FIG. 8, this figure depicts another example of modular quantum circuit transformation in accordance with an illustrative embodiment. In particular, FIG. 8 depicts results of executing a portion of quantum circuit transpiler 314 in FIG. 3.

FIG. 8 depicts input quantum circuit 810 modeled in a DAG format as directed acrylic graph 820. Application 314 models each input qubit as a starting vertex—for example, starting vertices 830. Application 314 models each output qubit as an ending vertex—for example, ending vertices 840. Between starting and ending vertices, an embodiment models operations on qubits as vertices—for example, vertices 850.

With reference to FIG. 9, this figure depicts another example of modular quantum circuit transformation in accordance with an illustrative embodiment. In particular, FIG. 9 depicts results of executing a portion of quantum circuit transpiler 314 in FIG. 3.

FIG. 9 depicts results of an analysis operation on input quantum circuit 910. In particular, the analysis operation is to divide input quantum circuit 910 into two sections: operations including only $q_0$ and $q_1$ (circuit section 912) and operations including only $q_0$ and $q_2$ (circuit section 914). Input quantum circuit 910 is shown modeled in a DAG format as directed acrylic graph 920. Circuit section 912 corresponds to graph section 922, and circuit section 914 corresponds to graph section 924.

Figure 10:
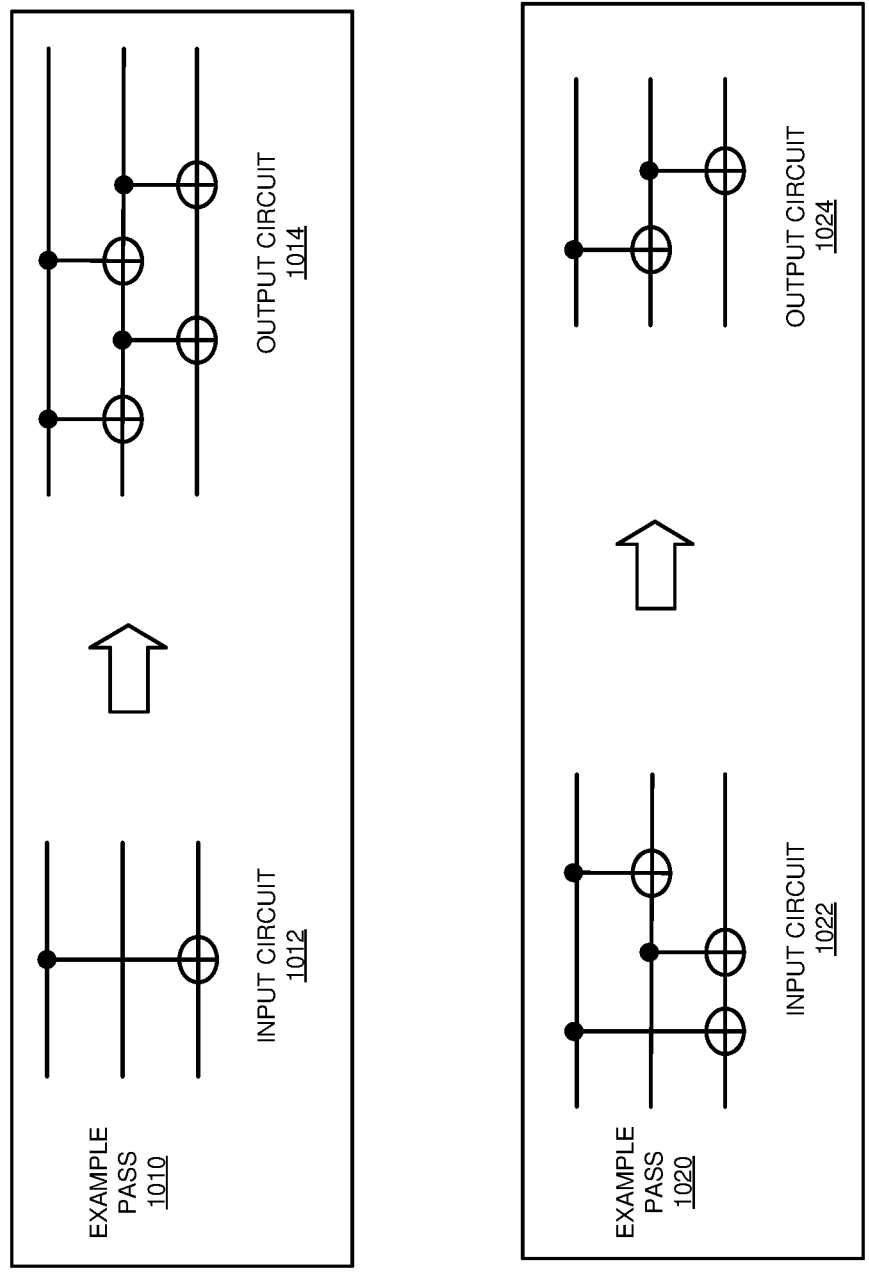
FIG. 10 depicts another example of modular quantum circuit transformation in accordance with an illustrative embodiment.

With reference to FIG. 10, this figure depicts another example of modular quantum circuit transformation in accordance with an illustrative embodiment. In particular, FIG. 10 depicts results of executing a portion of quantum circuit transpiler 314 in FIG. 3.

Example pass 1010 depicts results of performing a transformation operation to redistribute quantum gates in a circuit. In particular, a CNOT operation between two qubits can be implemented with four CNOT operations using an intermediate qubit, so that there is no direct interaction between the original qubits. For example, input circuit 1012 depicts a CNOT operation on $q_0$ and $q_2$. However, in a particular quantum processor configuration, it may not be possible for $q_0$ and $q_2$ to interact with each other. Thus, in the resulting output circuit 1014, using additional gates, $q_0$ and $q_1$ interact, and $q_1$ and $q_2$ interact, but $q_0$ and $q_2$ no longer interact with each other. However, both input circuit 1012 and output circuit 1014 are equivalent circuits.

Example pass 1020 depicts results of performing a transformation operation to simplify a circuit. As shown, input circuit 1022 includes three CNOT gates, while output circuit 1024, depicting the results of the transformation operation, includes only two CNOT gates. Both input circuit 1022 and output circuit 1024 are equivalent circuits.

Figure 11:
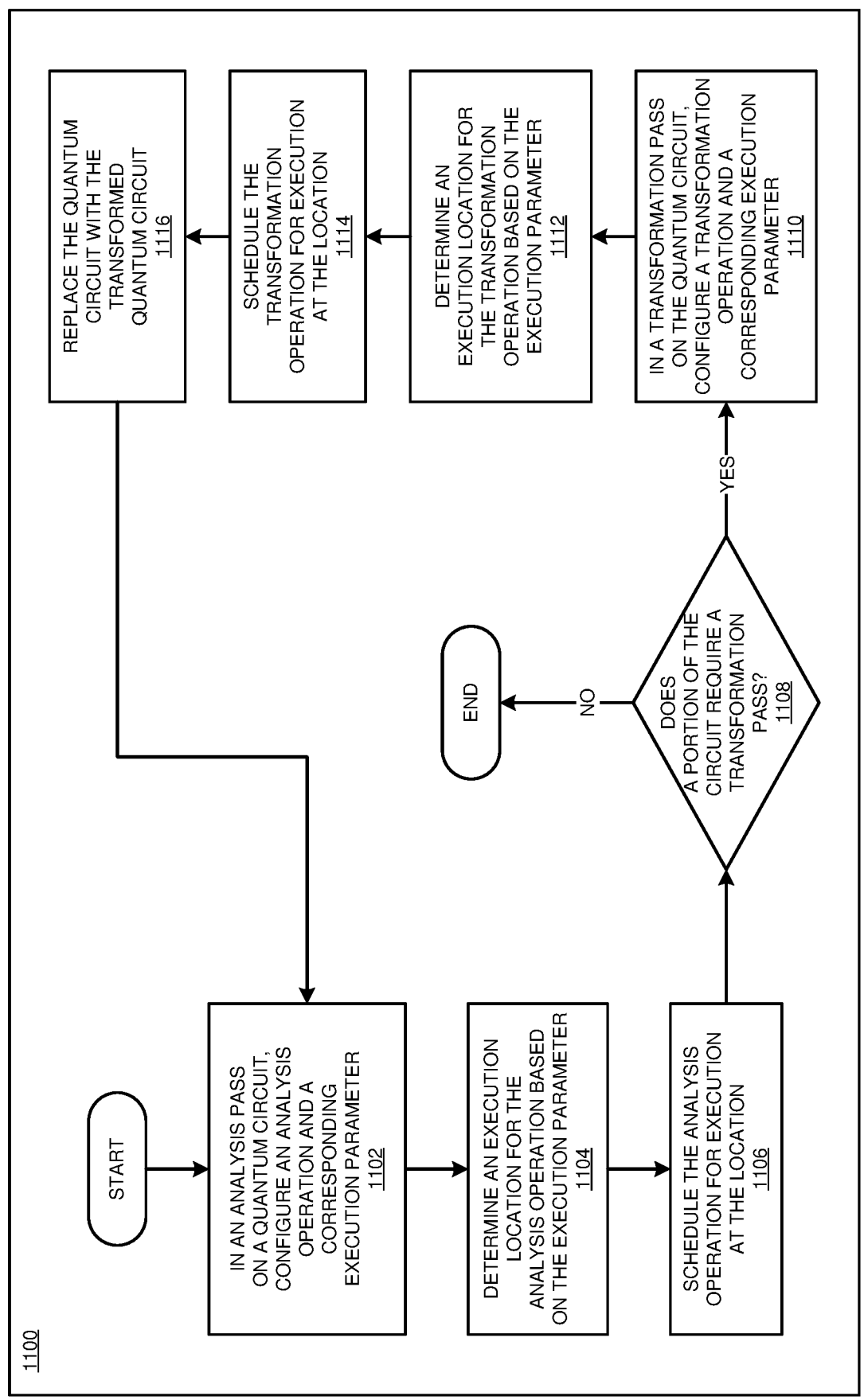
FIG. 11 depicts a flowchart of an example application for modular quantum circuit transformation, in accordance with an illustrative embodiment.

With reference to FIG. 11, this figure depicts a flowchart of an example application 1100 for modular quantum circuit transformation, in accordance with an illustrative embodiment. Application 1100 can be implemented in quantum circuit transpiler 314 in FIG. 3.

In block 1102, in an analysis pass on a quantum circuit, the application configures an analysis operation and a corresponding execution parameter. In block 1104, the application determines an execution location for the analysis operation based on the execution parameter. In block 1106, the application schedules the analysis operation for execution at the location. In block 1108, the application checks whether a portion of the circuit requires a transformation pass to satisfy a constraint on the quantum circuit design. If not ("NO" path of block 1108), the application ends. Otherwise ("YES" path of block 1108), in block 1110, the application, in a transformation pass on a quantum circuit, configures a transformation operation and a corresponding execution parameter. In block 1112, the application determines an execution location for the transformation operation based on the execution parameter. In block 1114, the application schedules the transformation operation for execution at the location. In block 1116, the application replaces the quantum circuit with the transformed quantum circuit. Then the application returns to block 1102.

Thus, a computer implemented method, system or apparatus, and computer program product are provided in the illustrative embodiments for modular quantum circuit transformation and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    configuring a hybrid data processing environment comprising a classical computing system and a quantum computing system, the configuring resulting in a configured quantum computing system;
    producing a first quantum circuit from the classical computing system, the first quantum circuit being executable using a generic quantum computing system;
    executing, at an execution location in the classical computing system conforming to a first analysis execution parameter, a first analysis operation on the first quantum circuit, the execution producing first output metadata of the first quantum circuit;
    identifying, using the first output metadata, a portion of the first quantum circuit that should be transformed to satisfy a quantum circuit design constraint, the quantum circuit design constraint comprising quantum processor configuration data specific to the configured quantum computing system; and
    transforming the portion, in a first transformation pass according to a first transformation operation, resulting in a second quantum circuit, by reconfiguring a gate in the first quantum circuit such that a qubit used in the gate complies with the quantum circuit design constraint while participating in the second quantum circuit, the second quantum circuit executable using the configured quantum computing system.

2. The method of claim 1, wherein the first analysis execution parameter defines a restriction on performing the first analysis operation.

3. The method of claim 1, wherein the first analysis execution parameter comprises a computational resource requirement of the first analysis operation.

4. The method of claim 1, wherein the first analysis execution parameter comprises a policy associated with the first analysis operation, wherein the policy defines an account-based restriction on performance of the first analysis operation.

5. The method of claim 1, wherein the first analysis execution parameter comprises a policy associated with the first analysis operation, wherein the policy defines a geographic restriction on performance of the first analysis operation.

6. The method of claim 1, wherein the first transformation operation is configured with a corresponding first transformation execution parameter, wherein the first transformation execution parameter defines a restriction on performing the first transformation operation.

7. The method of claim 6, further comprising:
    determining, based on the first output metadata, the first transformation operation and the corresponding first transformation execution parameter, an execution location in the classical computing system for the first transformation operation; and
    scheduling, for execution at the execution location, the first transformation operation.

8. The method of claim 7, wherein the first transformation execution parameter comprises a computational resource requirement of the first transformation operation.

9. The method of claim 7, wherein the first transformation execution parameter comprises a policy associated with the first transformation operation, wherein the policy defines an account-based restriction on performance of the first transformation operation.

10. The method of claim 7, wherein the first transformation execution parameter comprises a policy associated with the first transformation operation, wherein the policy defines a geographic restriction on performance of the first transformation operation.

11. A computer usable program product comprising one or more computer-readable storage devices, and program instructions stored on at least one of the one or more storage devices, the stored program instructions comprising:
    program instructions to configure a hybrid data processing environment comprising a classical computing system and a quantum computing system, the configuring resulting in a configured quantum computing system;

program instructions to produce a first quantum circuit from the classical computing system, the first quantum circuit being executable using a generic quantum computing system;

program instructions to execute, at an execution location in the classical computing system conforming to a first analysis execution parameter, a first analysis operation on the first quantum circuit, the execution producing first output metadata of the first quantum circuit;

program instructions to identify, using the first output metadata, a portion of the first quantum circuit that should be transformed to satisfy a quantum circuit design constraint, the quantum circuit design constraint comprising quantum processor configuration data specific to the configured quantum computing system; and program instructions to transform the portion, in a first transformation pass according to a first transformation operation, resulting in a second quantum circuit, by reconfiguring a gate in the first quantum circuit such that a qubit used in the gate complies with the quantum circuit design constraint while participating in the second quantum circuit, the second quantum circuit executable using the configured quantum computing system.

12. The computer usable program product of claim 11, wherein the first analysis execution parameter defines a restriction on performing the first analysis operation.

13. The computer usable program product of claim 11, wherein the first analysis execution parameter comprises a computational resource requirement of the first analysis operation.

14. The computer usable program product of claim 11, wherein the first analysis execution parameter comprises a policy associated with the first analysis operation, wherein the policy defines an account-based restriction on performance of the first analysis operation.

15. The computer usable program product of claim 11, wherein the stored program instructions are stored in a computer readable storage device in a data processing system, and wherein the stored program instructions are transferred over a network from a remote data processing system.

16. The computer usable program product of claim 11, wherein the stored program instructions are stored in a computer readable storage device in a server data processing system, and wherein the stored program instructions are downloaded over a network to a remote data processing system for use in a computer readable storage device associated with the remote data processing system.

17. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:

program instructions to configure a hybrid data processing environment comprising a classical computing system and a quantum computing system, the configuring resulting in a configured quantum computing system;

program instructions to produce a first quantum circuit from the classical computing system, the first quantum circuit being executable using a generic quantum computing system;

program instructions to execute, at an execution location in the classical computing system conforming to a first analysis execution parameter, a first analysis operation on the first quantum circuit, the execution producing first output metadata of the first quantum circuit;

program instructions to identify, using the first output metadata, a portion of the first quantum circuit that should be transformed to satisfy a quantum circuit design constraint, the quantum circuit design constraint comprising quantum processor configuration data specific to the configured quantum computing system; and program instructions to transform the portion, in a first transformation pass according to a first transformation operation, resulting in a second quantum circuit, by reconfiguring a gate in the first quantum circuit such that a qubit used in the gate complies with the quantum circuit design constraint while participating in the second quantum circuit, the second quantum circuit executable using the configured quantum computing system.

* * * * *